United States Patent
Hirayama et al.

(10) Patent No.: US 12,310,266 B2
(45) Date of Patent: May 20, 2025

(54) STORAGE DEVICE

(71) Applicant: KIOXIA CORPORATION, Tokyo (JP)

(72) Inventors: Shigeyuki Hirayama, Kawasaki Kanagawa (JP); Takayuki Sasaki, Yokkaichi Mie (JP); Yukihiro Nomura, Tokyo (JP); Tsunehiro Ino, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 405 days.

(21) Appl. No.: 17/684,331

(22) Filed: Mar. 1, 2022

(65) Prior Publication Data

US 2023/0093157 A1 Mar. 23, 2023

(30) Foreign Application Priority Data

Sep. 21, 2021 (JP) ................................. 2021-153174

(51) Int. Cl.
*H10N 70/00* (2023.01)
*H10B 63/00* (2023.01)
*H10N 70/20* (2023.01)

(52) U.S. Cl.
CPC ........... *H10N 70/828* (2023.02); *H10B 63/20* (2023.02); *H10N 70/231* (2023.02); *H10N 70/841* (2023.02); *H10N 70/8828* (2023.02)

(58) Field of Classification Search
CPC .................................................. H10N 70/828
See application file for complete search history.

(56) References Cited

U.S. PATENT DOCUMENTS

| | | |
|---|---|---|
| 8,717,799 B2 | 5/2014 | Liu |
| 9,136,468 B2 | 9/2015 | Nakai et al. |
| 9,716,226 B2 | 7/2017 | Gealy et al. |
| 9,911,915 B2 | 3/2018 | Yang et al. |
| 10,026,895 B2 | 7/2018 | Kamata |
| 10,224,367 B2 | 3/2019 | Yang et al. |

(Continued)

FOREIGN PATENT DOCUMENTS

| | | |
|---|---|---|
| JP | 2002-208744 A | 7/2002 |
| JP | 6054479 B2 | 12/2016 |
| JP | 6567441 B2 | 8/2019 |
| JP | 2020-145364 A | 9/2020 |

OTHER PUBLICATIONS

T. Kato, et al., "Electronic Properties of Amorphous and Crystalline Ge2Sb2Te5 Films" Japanese Journal of Applied Physics, vol. 44, No. 10, 2005, pp. 7340-7344.

(Continued)

*Primary Examiner* — Mounir S Amer
(74) *Attorney, Agent, or Firm* — Kim & Stewart LLP

(57) ABSTRACT

A storage device includes a first electrode, a second electrode, and a resistance change storage layer between the first and second electrodes. The storage layer is either in a first resistance state or in a second resistance state having a resistance higher than the first resistance state and contains at least two elements selected from a group consisting of germanium, antimony, and tellurium. The storage device further includes an interface layer between the first electrode and the resistance change storage layer. The interface layer contains at least one of the elements of the resistance change storage layer and includes a conductive region and an insulating region.

7 Claims, 16 Drawing Sheets

(56) References Cited

U.S. PATENT DOCUMENTS

| | | |
|---|---|---|
| 10,790,443 B2 | 9/2020 | Han et al. |
| 2011/0079764 A1 | 4/2011 | Nishihara et al. |
| 2015/0123066 A1* | 5/2015 | Gealy .................. H10N 70/231 |
| | | 257/4 |
| 2020/0168792 A1 | 5/2020 | Song |
| 2020/0286954 A1 | 9/2020 | Usami et al. |
| 2020/0303641 A1 | 9/2020 | Ikeno et al. |
| 2020/0388649 A1* | 12/2020 | Takahashi ............ H10B 63/845 |
| 2021/0057275 A1* | 2/2021 | Pierreux ........... H01L 21/76802 |
| 2022/0310911 A1* | 9/2022 | Ok ....................... H10N 70/231 |
| 2022/0310912 A1* | 9/2022 | Bruce ................ H10N 70/8828 |

OTHER PUBLICATIONS

S. Song, et al., "Phase-change properties of GeSbTe thin films deposited by plasma-enchanced atomic layer deposition" Nanoscale Research Letters (2015) 10:89, pp. 1-5, DOI: 10.1186/s11671-015-0815-5.

K. Kita, et al., "Origin of electric dipoles formed at high-k/SiO2 interface" American Institute of Physics., Applied Physics Letters. 94, 132902 (2009), pp. 1-3, URL: https://doi.org/10.1063/1.3110968.

Y. Matsui et al., "Ta2O5 Interfacial Layer between GST and W Plug enabling Low Power Operation of Phase Change Memories," 2006 International Electron Devices Meeting, 2006, pp. 1-4.

G. Navarro et al., "Innovative PCM+OTS device with high sub-threshold non-linearity for non-switching reading operations and higher endurance performance" 2017 Symposium on VLSI Technology, 2017, pp. T94-T95.

P.V. Moskalev., "Convergence of percolation probability functions to cumulative distribution functions on square lattices with(1, 0)-neighborhood" Physica A, vol. 553 (2020) 124657, pp. 1-10 URL: https://doi.org/10.1016/j.physa.2020.124657.

H. Fukazawa et al., "Nanoconstricted structure for current-confined path in current-perpendicular-to-plane spin valves with high magnetoresistance" Journal of Applied Physics 97, 10C509 (2005), May 4, 2005, pp. 1-3 URL: https://doi.org/10.1063/1.1851673.

* cited by examiner

STORAGE DEVICE

CROSS-REFERENCE TO RELATED APPLICATION(S)

This application is based upon and claims the benefit of priority from Japanese Patent Application No. 2021-153174 filed Sep. 21, 2021, the entire contents of which are incorporated herein by reference.

FIELD

Embodiments described herein relate generally to a storage device including phase change memory or other resistance change memory.

BACKGROUND

A storage device in which resistance change storage elements such as phase change memory (PCM) elements are integrated on a semiconductor substrate has been proposed.

DETAILED DESCRIPTION

Embodiments provide a storage device having a resistance change storage element with high performance.

In general, according to one embodiment, a storage device includes a first electrode, a second electrode, and a resistance change storage layer between the first and second electrodes. The storage layer is either in a first resistance state or in a second resistance state having a resistance higher than the first resistance state and comprises at least two elements selected from a group consisting of germanium, antimony, and tellurium. The storage device further includes an interface layer between the first electrode and the resistance change storage layer. The interface layer comprises at least one of the elements of the resistance change storage layer and includes a conductive region and an insulating region.

Hereinafter, embodiments will be described with reference to the accompanying drawings.

First Embodiment

Figure 1:
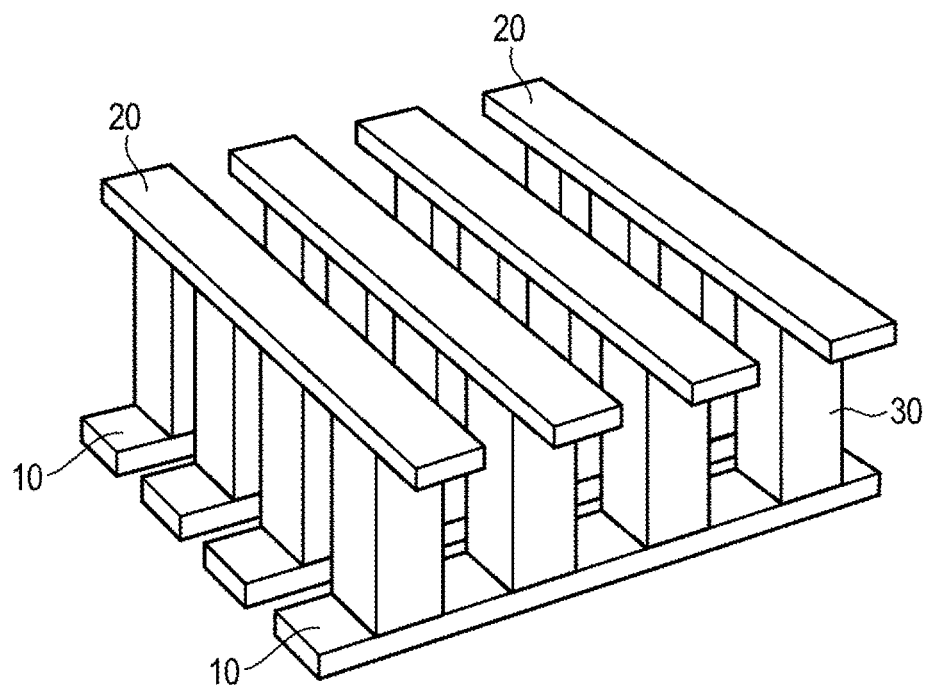
FIG. 1 is a perspective view schematically illustrating a storage device according to a first embodiment.

FIG. 1 is a perspective view schematically illustrating a non-volatile storage device according to a first embodiment.

As illustrated in FIG. 1, a plurality of memory cells 30 is connected between a plurality of wirings 10 and a plurality of wirings 20. One of the wiring 10 and the wiring 20 corresponds to a word line, and the other corresponds to a bit line.

Each memory cell 30 includes a resistance change storage element and a selector or a switching element connected in series with the resistance change storage element.

A phase change memory (PCM) element is used as the resistance change storage element. The resistance change storage element has a low resistance state and a high resistance state having a resistance higher than the resistance in the low resistance state. Therefore, the resistance change storage element may store binary data according to its resistance state (e.g., a low resistance state as one value and a high resistance state as another value).

The selector is a two-terminal switching element having a non-linear current-voltage characteristic, and is turned on when a voltage applied between the two terminals is equal to or higher than a predetermined voltage, and is turned off when the voltage applied between the two terminals is smaller than the predetermined voltage.

By applying a voltage equal to or higher than a threshold voltage between the wiring 10 and the wiring 20, the selector is turned on, and writing or reading may be performed on the resistance change storage element.

In each memory cell 30, the resistance change storage element and the selector may not be separate elements. As will be described in a modification later, a resistance change storage layer and a selector material layer or a switching material layer may be stacked in series.

Figure 2:
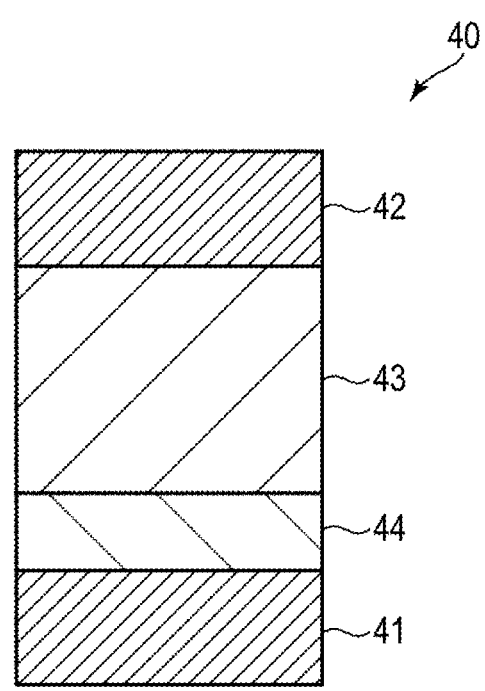
FIG. 2 is a cross-sectional view schematically illustrating a resistance change storage element of a storage device according to a first embodiment.

FIG. 2 is a cross-sectional view schematically illustrating the resistance change storage element 40 provided in the memory cell 30. As described above, the PCM element is used as the resistance change storage element 40.

The resistance change storage element 40 includes an electrode 41, an electrode 42, a resistance change storage layer 43, and an interface layer 44.

The resistance change storage layer 43 is provided between the electrode 41 and the electrode 42, and can be in a low resistance state or a high resistance state having a resistance higher than the resistance in the low resistance state.

The resistance change storage layer 43 contains at least two elements selected from germanium (Ge), antimony (Sb), and tellurium (Te).

Specifically, the resistance change storage layer 43 is formed of a GeSbTe layer (germanium (Ge), antimony (Sb), and tellurium (Te)), a AgInSbTe layer (silver (Ag), indium (In), antimony (Sb), and tellurium (Te)), a CrGeTe layer (chromium (Cr), germanium (Ge), and tellurium (Te)), or a CuGeTe layer (copper (Cu), germanium (Ge), and tellurium (Te)).

The resistance change storage layer 43 undergoes a phase change between a crystalline phase and an amorphous phase, and is in the low resistance state in the crystalline phase and in the high resistance state in the amorphous phase.

The interface layer 44 is provided between the electrode 41 and the resistance change storage layer 43, and is in contact with the electrode 41 and the resistance change storage layer 43. The interface layer 44 contains at least one element contained in the resistance change storage layer 43. The thickness of the interface layer 44 is about 1 to 8 nm.

Figure 3:
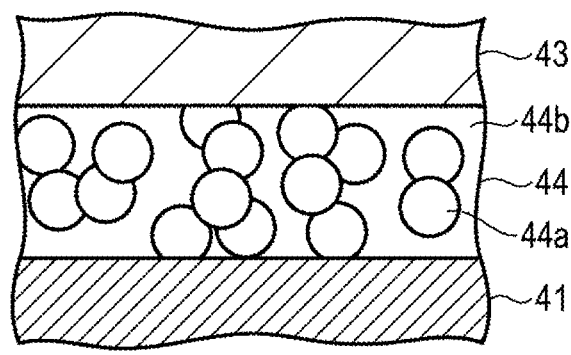
FIG. 3 is a cross-sectional view schematically illustrating an interface layer provided in a resistance change storage element of a storage device according to a first embodiment.

FIG. 3 is a cross-sectional view schematically illustrating the interface layer 44.

As illustrated in FIG. 3, the interface layer 44 includes conductive regions 44a and insulating regions 44b. The ratio of the conductive regions 44a to the entire interface layer 44 is preferably about 40 to 60%.

The conductive region 44a contains at least one element contained in the resistance change storage layer 43 or a nitride of at least one element contained in the resistance change storage layer 43. For example, the resistance change storage layer 43 contains at least one of germanium (Ge), germanium nitride, antimony (Sb), antimony nitride, tellurium (Te), and tellurium nitride. Further, a part of the conductive region 44a is continuously provided between the electrode 41 and the resistance change storage layer 43. That is, a part of the conductive region 44a forms a conductive path between the electrode 41 and the resistance change storage layer 43.

The insulating region 44b contains an oxide or a nitride. For example, the insulating region 44b includes silicon oxide ($SiO_2$), germanium oxide ($GeO_2$), silicon nitride (SiN), germanium nitride (GeN), antimony nitride (SbN), aluminum oxide ($Al_2O_3$), hafnium oxide ($HfO_2$), tantalum oxide ($Ta_2O_5$), titanium oxide ($TiO_2$), or lanthanum aluminum oxide ($LaAlO_3$). Further, as for the material of the insulating region 44b, it is preferable to use a more stable material from the viewpoint of Gibbs free energy.

The interface layer 44 can be formed by co-sputtering using the material of the conductive region 44a and the material of the insulating region 44b. Alternatively, the interface layer 44 may be formed by forming a material containing an element contained in the conductive region 44a and an element contained in the insulating region 44b, and then performing an oxidation process or a nitriding process.

As described above, in the present embodiment, the interface layer 44 includes the conductive regions 44a and the insulating regions 44b. Therefore, when writing is performed by causing a current to flow between the electrode 41 and the electrode 42, the current flows intensively in the conductive regions 44a of the interface layer 44. As a result, a high current density may be obtained due to the current constriction effect, and a high temperature rise can be obtained. Thus, it is possible to raise the temperature of the resistance change storage layer 43. Further, since high thermal resistance can be obtained by the insulating region 44b, thermal diffusion can be prevented and the temperature of the resistance change storage layer 43 can be raised. As described above, in the present embodiment, since the interface layer 44 includes the conductive regions 44a and the insulating regions 44b, the phase change of the resistance change storage layer 43 can be efficiently performed by increasing the temperature of the resistance change storage layer, and effective writing can be performed.

Further, in the present embodiment, since the interface layer 44 includes the conductive regions 44a and the insulating regions 44b, it is possible to prevent dielectric breakdown of the resistance change storage element 40. That is, since a resistance change storage element of the related art uses an insulating material for the interface layer, dielectric breakdown of the interface layer is occasionally observed when a voltage is applied. Therefore, in the related art, the reliability of the resistance change storage element may be lowered. In the present embodiment, it is possible to improve the reliability of the resistance change storage element 40 since such dielectric breakdown of the interface layer can be reduced.

Further, in the present embodiment, the interface layer 44 contains at least one element contained in the resistance change storage layer 43. Therefore, the affinity between the interface layer 44 and the resistance change storage layer 43 can be enhanced, and the characteristics and reliability of the resistance change storage element 40 can be improved.

Next, a modification of the present embodiment will be described.

Figure 4:
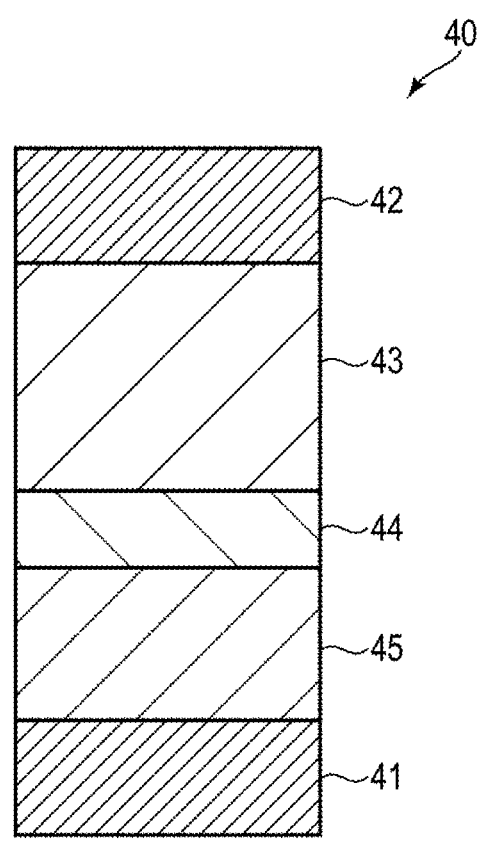
FIG. 4 is a cross-sectional view schematically illustrating a resistance change storage element according to a first modification of a first embodiment.

FIG. 4 is a cross-sectional view schematically illustrating a resistance change storage element 40 according to a first modification of the present embodiment.

In the modification, a selector material layer or a switching material layer 45 is provided between the electrode 41 and the interface layer 44. The selector material layer 45 has the same characteristics and functions as the selector or the switching element described above. Therefore, the selector material layer 45 is set to the ON state or the OFF state according to the voltage applied between the electrode 41 and the electrode 42. The selector material layer 45 contains at least one of germanium (Ge), silicon (Si), and tellurium (Te). Specifically, GeSe, GeTe, SiTe, ZnTe, CTe, BTe, GeSeN, GeSeAs, GeSeSbN, GeAsTeSiN, GeAsSeTeSi and the like are used for the selector material layer 45.

The interface layer 44 has conductive and insulating regions regardless of an applied voltage. On the other hand, the selector material layer 45 becomes an insulating region as a whole when no voltage is applied, and a conductive region appears therein when the voltage is applied. Therefore, the selector material layer 45 is completely different from the interface layer 44 in both characteristics and functions.

In this modification as well, it is possible to obtain the same effect as that of the above-described embodiment.

Figure 5:
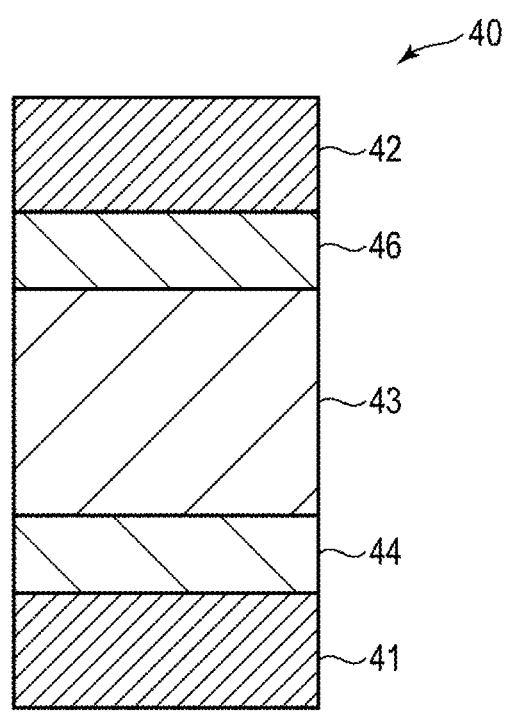
FIG. 5 is a cross-sectional view schematically illustrating a resistance change storage element according to a second modification of a first embodiment.

FIG. 5 is a cross-sectional view schematically illustrating a resistance change storage element 40 according to a second modification of the present embodiment.

In this modification, an interface layer 46 is provided in addition to and separately from the interface layer 44. The interface layer 46 is provided between the electrode 42 and the resistance change storage layer 43, and is in contact with the electrode 42 and the resistance change storage layer 43. The interface layer 46 contains at least one element contained in the resistance change storage layer 43.

The interface layer 46 may be formed of the same material as the interface layer 44 and may have the same characteristics and functions as the interface layer 44. It is note that while the interface layer 44 includes both conductive and insulating regions, the interface layer 46 is only required to include at least conductive regions and may or may not include insulating regions.

In this modification as well, it is possible to obtain the same effect as that of the above-described embodiment.

Figure 6:
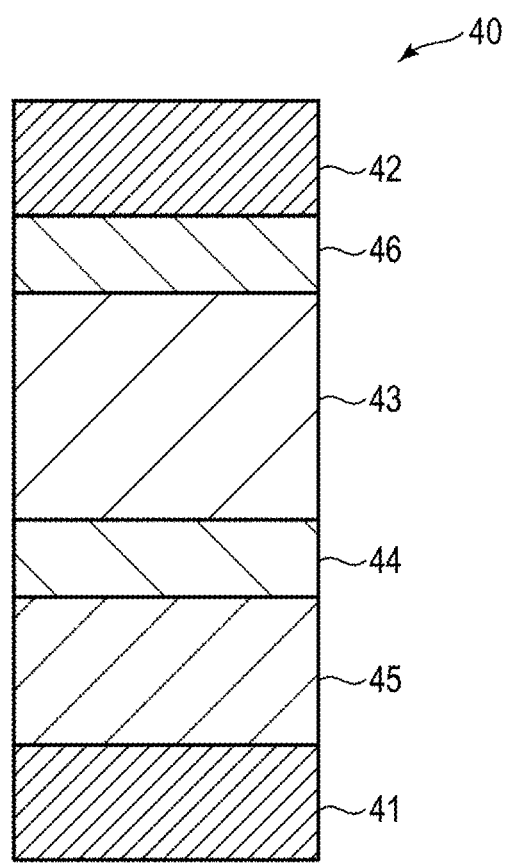
FIG. 6 is a cross-sectional view schematically illustrating a resistance change storage element according to a third modification of a first embodiment.

FIG. 6 is a cross-sectional view schematically illustrating a configuration of a resistance change storage element 40 according to a third modification of the present embodiment.

In this modification, the selector material layer 45 described in the first modification and the interface layer 46 described in the second modification are provided. The material, characteristics, and functions of the selector material layer 45 are the same as those of the selector material layer 45 described in the first modification, and the material, characteristics, and functions of the interface layer 46 are the same as those of the interface layer 46 described in the second modification.

In this modification as well, it is possible to obtain the same effect as that of the above-described embodiment.

Figure 7:
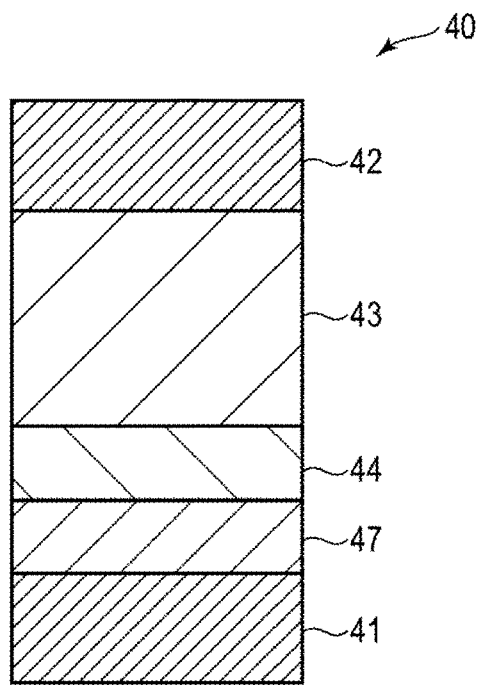
FIG. 7 is a cross-sectional view schematically illustrating a resistance change storage element according to a fourth modification of a first embodiment.

FIG. 7 is a cross-sectional view schematically illustrating a resistance change storage element 40 according to a fourth modification of the first embodiment.

In this modification, an interface layer 47 is provided in addition to and separately from the interface layer 44. The interface layer 47 is provided between the electrode 41 and the interface layer 44, and has the same characteristics and functions as the selector described above.

The interface layer 47 includes conductive and insulating regions. The conductive region contains at least one of germanium (Ge), silicon (Si), and tellurium (Te). Specifically, the same material as that of the selector material layer 45 may be used for the conductive region. The insulating region is formed of silicon oxide ($SiO_2$), germanium oxide ($GeO_2$), silicon nitride (SiN), germanium nitride (GeN), antimony nitride (SbN), aluminum oxide ($Al_2O_3$), hafnium oxide ($HfO_2$), tantalum oxide ($Ta_2O_5$), titanium oxide ($TiO_2$), or lanthanum aluminum oxide ($LaAlO_3$).

The interface layer 44 may have a selector function of the interface layer 47. In such a case, the interface layer 47 can be omitted.

In this modification as well, it is possible to obtain the same effect as that of the above-described embodiment.

Figure 8:
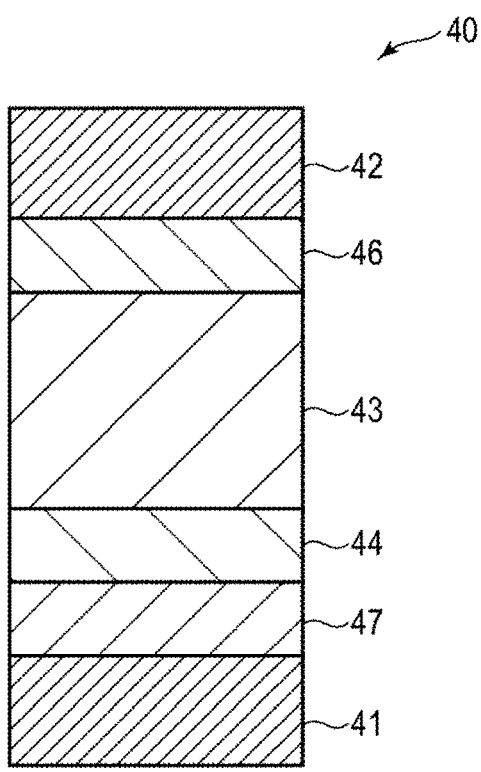
FIG. 8 is a cross-sectional view schematically illustrating a resistance change storage element according to a fifth modification of a first embodiment.

FIG. 8 is a cross-sectional view schematically illustrating a resistance change storage element 40 according to a fifth modification of the first embodiment.

In this modification, the interface layer 46 described in the second modification and the interface layer 47 described in the fourth modification are provided. The material, characteristics, and functions of the interface layer 46 are the same as those of the interface layer 46 described in the second modification, and the materials, characteristics, and functions of the interface layer 47 are the same as those of the interface layer 47 described in the fourth modification.

In this modification as well, it is possible to obtain the same effect as that of the above-described embodiment.

In the first embodiment, not only a PCM element but also an interfacial phase change memory (iPCM) element may be used as the resistance change storage element 40.

Second Embodiment

Next, a second embodiment will be described. This embodiment includes some elements described in the first embodiment, and the descriptions thereof will not be repeated.

Figure 9:
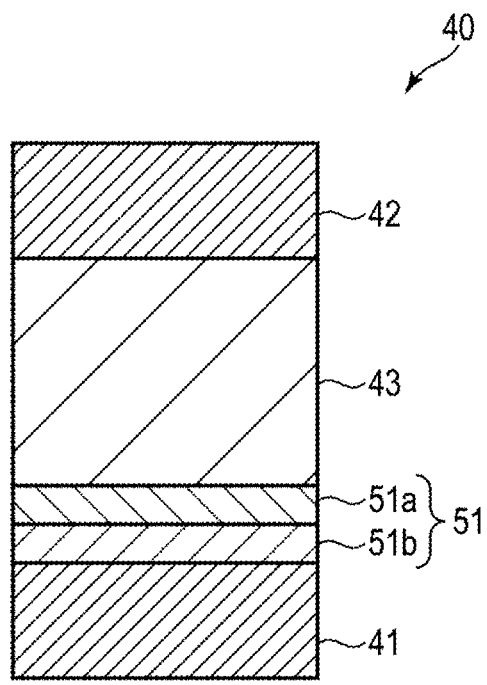
FIG. 9 is a cross-sectional view schematically illustrating a resistance change storage element according to a second embodiment.

FIG. 9 is a cross-sectional view schematically illustrating a resistance change storage element 40 according to the second embodiment.

The resistance change storage element 40 includes the electrode 41, the electrode 42, the resistance change storage layer 43, and an interface layer 51.

The resistance change storage layer 43 contains at least two elements selected from germanium (Ge), antimony (Sb), and tellurium (Te), as in the first embodiment. For example, the resistance change storage layer 43 is formed of a $Ge_2Sb_2Te_5$ layer, an $Sb_2Te_3$ layer, or a GeTe layer.

The interface layer 51 is provided between the electrode 41 and the resistance change storage layer 43, and includes a nitride layer 51a and an oxide layer 51b that are stacked. The nitride layer 51a is provided between the electrode 41 and the resistance change storage layer 43, and the oxide layer 51b is provided between the electrode 41 and the nitride layer 51a. The thickness of each of the nitride layer 51a and the oxide layer 51b is 1 nm or less.

The nitride layer 51a contains at least one of silicon (Si) and germanium (Ge), and nitrogen (N). For example, the nitride layer 51a is formed of $(Si_xGe_{1-x})N_y$ (0≤x≤1, 0<y<1).

The nitride layer 51a may be an aluminum nitride (AlN) layer, a tantalum nitride (TaN) layer, a tantalum-silicon nitride (TaSiN) layer, a titanium oxynitride (TiON) layer, a titanium-aluminum nitride TiAlN layer, a carbonitride (CN) layer, or a zirconium nitride (ZrN) layer.

The oxide layer 51b can be a $Ta_2O_5$ layer), a $TiO_2$ layer), a $SiO_2$ layer, a $GeO_2$ layer, a $ZrO_2$ layer, a $Sc_2O_3$ layer, an $Al_2O_3$ layer, a $HfO_2$ layer, a $Y_2O_3$ layer, or a $La_2O_3$ layer.

The nitride layer 51a is a dense layer, and can prevent the diffusion of elements contained in the resistance change storage layer 43. In particular, it is possible to prevent the diffusion of the elements contained in the resistance change storage layer 43 at the time of the phase change of the resistance change storage layer 43. Further, since the oxide layer 51b has low thermal conductivity or high thermal resistance, it is possible to prevent thermal diffusion and raise the temperature of the resistance change storage layer 43.

As described above, in the present embodiment, since the interface layer 51 includes the nitride layer 51a and the oxide layer 51b, the phase change of the resistance change storage layer 43 can be accurately performed, and effective writing can be performed.

Next, a modification of this embodiment will be described.

Figure 10:
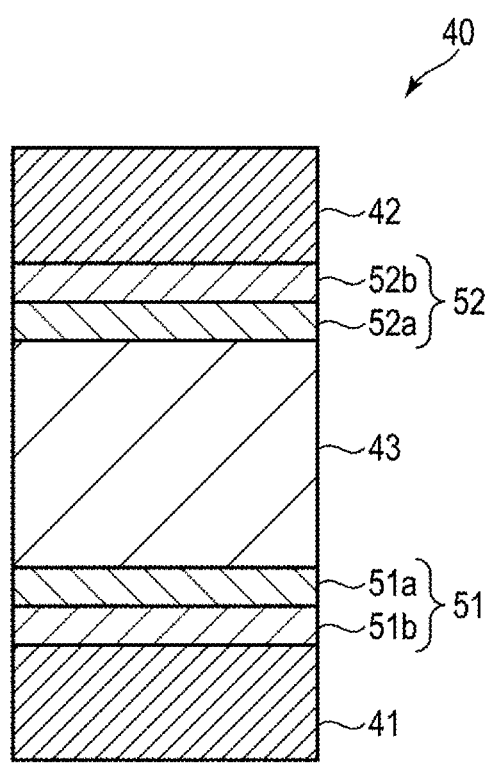
FIG. 10 is a cross-sectional view schematically illustrating a resistance change storage element according to a first modification of a second embodiment.

FIG. 10 is a cross-sectional view schematically illustrating a resistance change storage element 40 according to a first modification of the present embodiment.

In this modification, an interface layer 52 is further provided in addition to the interface layer 51. The interface layer 52 is provided between the electrode 42 and the resistance change storage layer 43, and includes a nitride layer 52a and an oxide layer 52b that are stacked. The nitride layer 52a is provided between the electrode 42 and the resistance change storage layer 43, and the oxide layer 52b is provided between the electrode 42 and the nitride layer 52a. The materials and the like of the nitride layer 52a and the oxide layer 52b are the same as those of the nitride layer 51a and the oxide layer 51b described in the above-described embodiment.

In the present embodiment, since the interface layer 52 is further provided in addition to the interface layer 51, it is possible to further enhance the effect of the above-described embodiment.

Figure 11:
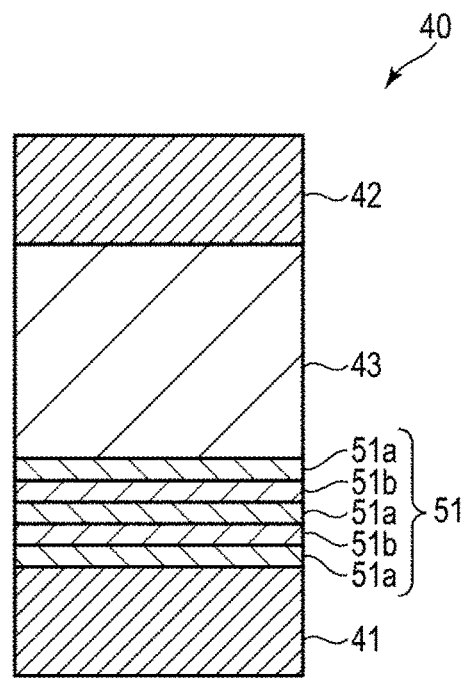
FIG. 11 is a cross-sectional view schematically illustrating a resistance change storage element according to a second modification of a second embodiment.

FIG. 11 is a cross-sectional view schematically illustrating a resistance change storage element 40 according to a second modification of the present embodiment.

In this modification, the interface layer 51 includes a plurality of nitride layers 51a and a plurality of oxide layers 51b that are alternately stacked. The thickness of each of the nitride layer 51a and the oxide layer 51b is 1 nm or less, and the total thickness of the interface layer 51 is 8 nm or less.

In this modification, since the plurality of nitride layers 51a and the plurality of oxide layers 51b are alternately stacked, thermal diffusion can be further prevented, and the effects of the above-described embodiment can be further enhanced.

Figure 12:
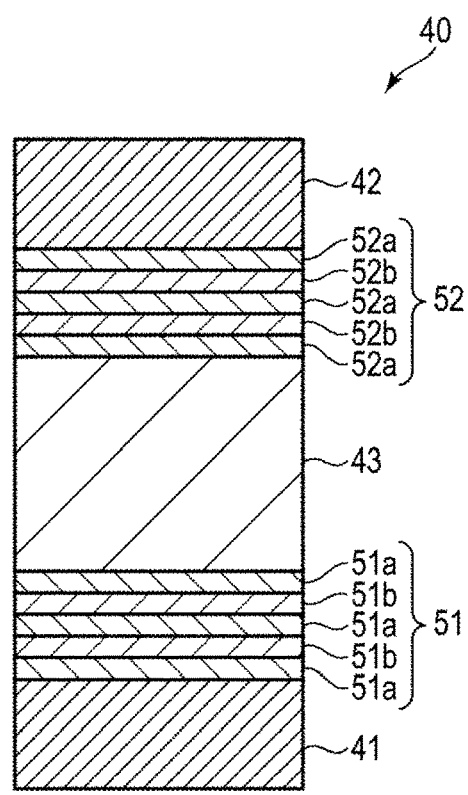
FIG. 12 is a cross-sectional view schematically illustrating a resistance change storage element according to a third modification of a second embodiment.

FIG. 12 is a cross-sectional view schematically illustrating a resistance change storage element 40 according to a third modification of the present embodiment.

In this modification, the interface layer 51 includes the plurality of nitride layers 51a and the plurality of oxide layers 51b that are alternately stacked, and the interface layer 52 includes the plurality of nitride layers 52a and the plurality of oxide layers 52b that are alternately stacked. Therefore, it is possible to further enhance the effects of the above-described embodiments.

In the present embodiment, not only a PCM element but also an iPCM element may be used as the resistance change storage element 40.

Third Embodiment

Next, a third embodiment will be described. This embodiment includes some elements described in the first embodiment, and the descriptions thereof will not be repeated.

Figure 13:
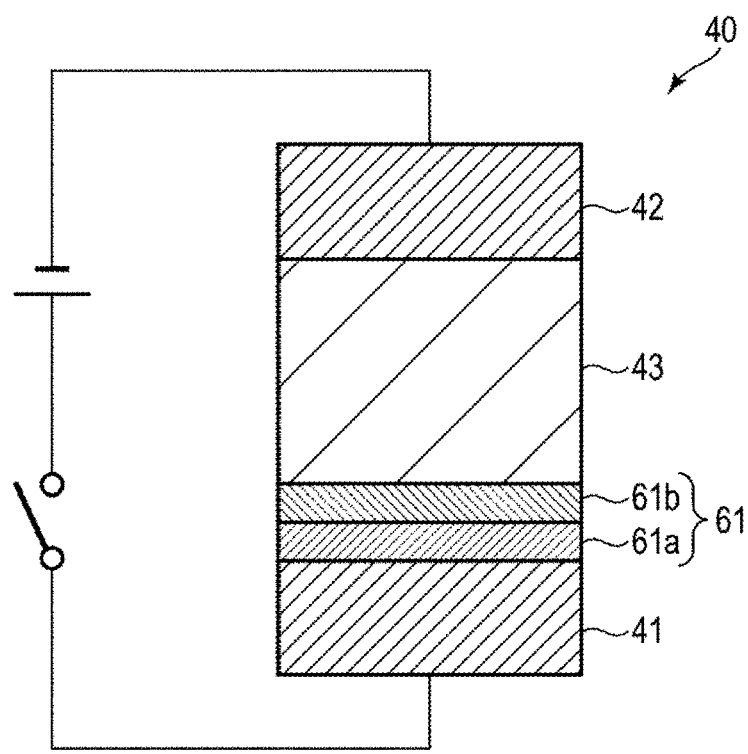
FIG. 13 is a view illustrating a resistance change storage element according to a third embodiment and a direction in which a read voltage is applied to the resistance change storage element.

FIG. 13 is a view illustrating a resistance change storage element 40 according to the present embodiment and a direction in which a read voltage is applied to the resistance change storage element 40.

The resistance change storage element 40 includes the electrode 41, the electrode 42, the resistance change storage layer 43, and an interface layer 61.

The resistance change storage layer 43 contains at least two elements selected from germanium (Ge), antimony (Sb), and tellurium (Te), as in the first embodiment.

The interface layer 61 is provided between the electrode 41 and the resistance change storage layer 43, and includes an oxide layer 61a and an oxide layer 61b that are stacked.

When a voltage is applied between the electrode 41 and the electrode 42 to read out the resistance state of the resistance change storage layer 43, the voltage is applied such that the potential of the electrode 41 is relatively higher than the potential of the electrode 42. In such a case, among the oxide layer 61a and the oxide layer 61b, the oxide layer 61a having a relatively low oxygen area density is located on the side of the electrode 41 to which a relatively high voltage is applied. Specifically, the oxide layer 61a having a relatively low oxygen area density is in contact with the electrode 41, and the oxide layer 61b having a relatively high oxygen area density is in contact with the resistance change storage layer 43. In this context, the "oxygen areal density" refers to the number of oxygen atoms per unit area in a plane parallel to the interface between the oxide layer 61a and the oxide layer 61b.

In this example, the oxide layer 61a having a relatively low oxygen areal density is a $SiO_2$ layer.

The oxide layer 61b having a relatively high oxygen areal density is a high-k layer (that is, a high dielectric constant layer). Specifically, the oxide layer 61b is a $TiO_2$, a $Ta_2O_5$ layer, a $ZrO_2$ layer, a $Sc_2O_3$ layer, an $Al_2O_3$ layer, or a $HfO_2$ layer.

So long as the $SiO_2$ layer and the resistance change storage layer 43 are adhered to each other, a lanthanum oxide ($La_2O_3$) layer or yttrium oxide ($Y_2O_3$) layer may be used for the oxide layer 61a having a relatively low oxygen areal density, and a $SiO_2$ layer may be used for the oxide layer 61b having a relatively high oxygen areal density.

In the present embodiment, as described below, it is possible to increase a read margin when reading a resistance state of the resistance change storage layer 43 by the configuration as described above.

Figure 14:
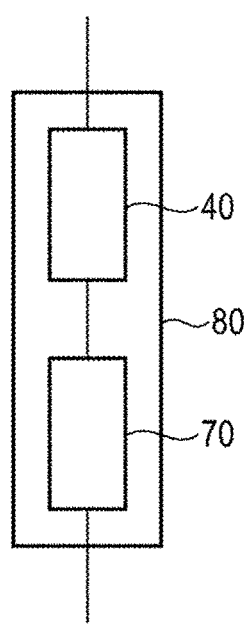
FIG. 14 is a view illustrating an equivalent circuit of a memory cell of a storage device according to a third embodiment.

FIG. 14 is a view illustrating an equivalent circuit of a memory cell 80 including the resistance change storage element 40 and a selector or a 2-terminal switching element 70 connected in series with the resistance change storage element 40.

Figure 15:
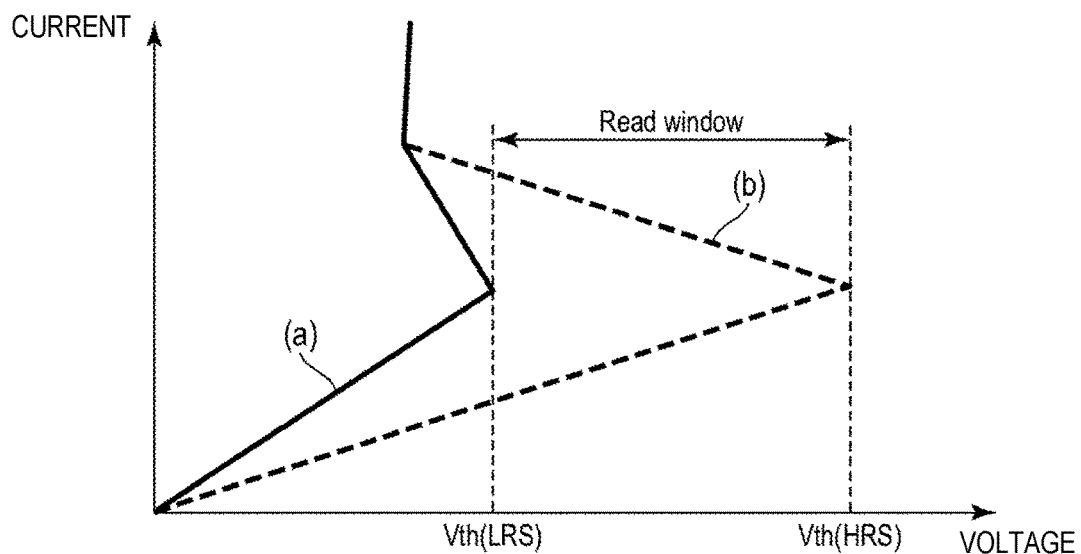
FIG. 15 depicts a relationship between a voltage applied to a memory cell and a current flowing through the memory cell when a resistance state set in a resistance change storage layer is read according to a third embodiment.

FIG. 15 depicts a relationship between a voltage applied to the memory cell 80 and a current flowing through the memory cell 80 when the resistance state of the resistance change storage layer 43 of the resistance change storage element 40 is read.

Reference numeral "(a)" of FIG. 15 represents the characteristics when the resistance change storage layer 43 is in the low resistance state, and reference numeral "(b)" of FIG. 15 represents characteristics when the resistance change storage layer 43 is in the high resistance state. Reference numeral "Vth(LRS)" shows a threshold voltage when the resistance change storage layer 43 is set to the low resistance state, and reference numeral "Vth(HRS)" is a threshold voltage when the resistance change storage layer 43 is set to the high resistance state.

As illustrated in FIG. 15, when the voltage applied to the memory cell 80 reaches the threshold voltage (Vth(LRS) or Vth(HRS)), the selector 70 shifts from the OFF state to the ON state, and the current flowing through the memory cell 80 rapidly increases.

When a difference (the read window) between the threshold voltage Vth(LRS) in the low resistance state and the threshold voltage Vth(HRS) in the high resistance state is small, the read margin becomes smaller and a read error may occur. Therefore, in order to prevent read errors, it is desirable to increase the difference between Vth(LRS) and Vth(HRS). In the present embodiment, as described below, it is possible to increase the difference between Vth(LRS) and Vth(HRS).

Figure 16:
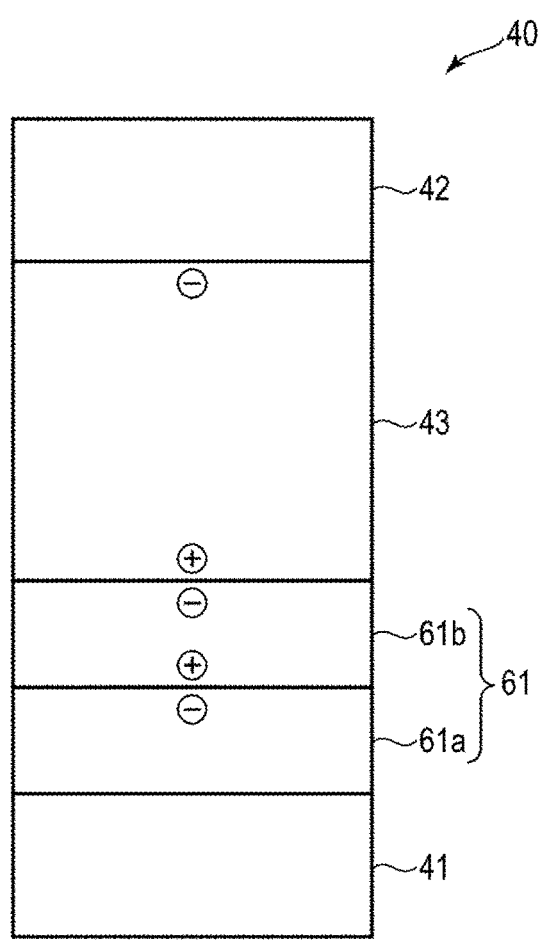
FIG. 16 depicts a state of electric charge inside a resistance change storage element according to a third embodiment when the resistance change storage layer is in a high resistance state.

FIG. 16 depicts a state of electric charge inside the resistance change storage element 40 when the resistance change storage layer 43 of the resistance change storage element 40 illustrated in FIG. 13 is in the high resistance state.

When the oxide layer 61a having a relatively low oxygen areal density and the oxide layer 61b having a relatively high oxygen areal density come into contact with each other, oxygen anions are substantially moved from the oxide layer 61b to the oxide layer 61a. Therefore, a negative charge appears at the interface on the oxide layer 61a, and a positive charge appears at the interface on the oxide layer 61b. Further, since the resistance change storage layer 43 is in the high resistance state, the resistance change storage layer 43 is in a state of being an insulator or a state close to an insulator. Therefore, a positive charge appears at the lower interface of the resistance change storage layer 43, and a negative charge appears at the upper interface of the resistance change storage layer 43. As a result, an internal electric field is generated in the resistance change storage layer 43 from the upper interface to the lower interface.

Considering a case where a voltage is applied to the memory cell 80 of FIG. 14 so that the potential of the electrode 41 is relatively higher than the potential of the electrode 42 in the above-mentioned state, the selector 70 in FIG. 14 is not turned on unless a voltage higher by a voltage of the internal electric field is applied to the memory cell 80. That is, in FIG. 15, the threshold voltage Vth(HRS) of the characteristic (b) when the resistance change storage layer 43 is set to the high resistance state shifts in the positive direction.

When the resistance change storage layer 43 is in the low resistance state, the resistance change storage layer 43 is in a state of being a conductor or a state close to a conductor. Therefore, the internal electric field as described above does not occur. That is, the threshold voltage Vth(LRS) of the characteristic (a) when the resistance change storage layer 43 is set to the low resistance state does not shift.

As described above, when the resistance change storage layer 43 is in the low resistance state, the threshold voltage Vth(LRS) does not shift, but when the resistance change storage layer 43 is in the high resistance state, the threshold voltage Vth(HRS) shifts in the positive direction. Therefore, the difference between Vth(LRS) and Vth(HRS) can be increased, and the read margin when reading the resistance state set in the resistance change storage layer 43 can be increased. Therefore, in the present embodiment, it is possible to prevent a read error, and it is possible to obtain an excellent storage device.

Next, a modification of this embodiment will be described.

Figure 17:
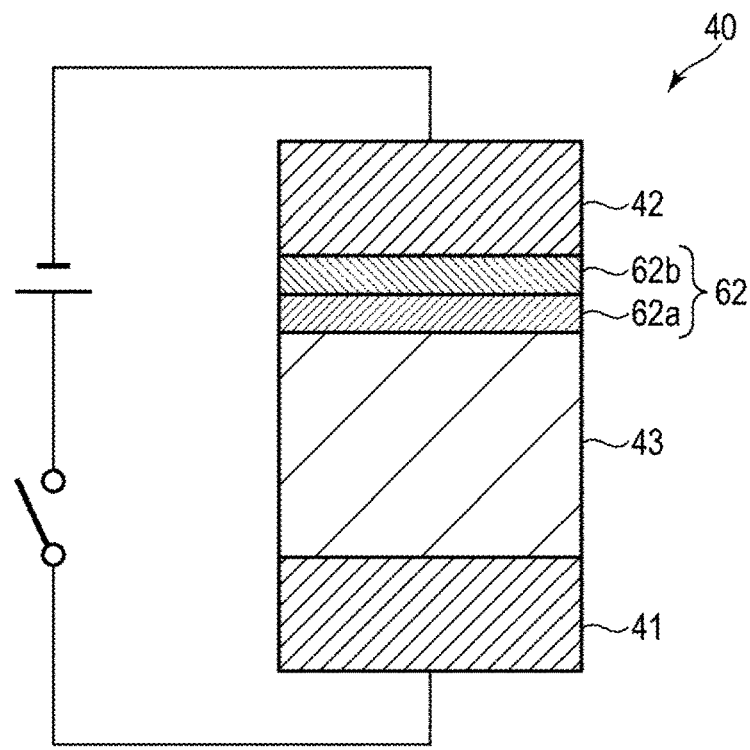
FIG. 17 is a view illustrating a resistance change storage element according to a first modification of a third embodiment and a direction in which a read voltage is applied to the resistance change storage element.

FIG. 17 is a view illustrating a resistance change storage element 40 according to a first modification of the present embodiment and a direction in which a read voltage is applied to the resistance change storage element 40.

In this modification, an interface layer 62 is provided between the electrode 42 and the resistance change storage layer 43, and includes an oxide layer 62a and an oxide layer 62b that are stacked.

When a voltage is applied between the electrode 41 and the electrode 42 to read out the resistance state of the resistance change storage layer 43, the voltage is applied so that the potential of the electrode 41 is relatively higher than the potential of the electrode 42. In such a case, among the oxide layer 62a and the oxide layer 62b, the oxide layer 62a having a relatively low oxygen areal density is located on the side of the electrode 41 to which a relatively high voltage is applied. Specifically, the oxide layer 62a having a relatively low oxygen areal density is in contact with the resistance change storage layer 43, and the oxide layer 62b having a relatively high oxygen areal density is in contact with the electrode 42.

The oxide layer 62a having a relatively low oxygen areal density is a high-k layer. Specifically, the oxide layer 62a is a $Y_2O_3$ layer or a $La_2O_3$ layer.

The oxide layer 62b having a relatively high oxygen areal density is a $SiO_2$ layer.

In this modification as well, according to the same principle as in the above-described embodiment, when the resistance change storage layer 43 is in the high resistance state, an internal electric field is generated in the resistance change storage layer 43 from the upper interface to the lower interface. Therefore, as in the above-described embodiment, the threshold voltage Vth(LRS) does not shift when the resistance change storage layer 43 is in the low resistance state, but the threshold voltage Vth(HRS) shifts in the positive direction when the resistance change storage layer 43 is in the high resistance state. Therefore, also in this modification, the difference between Vth(LRS) and Vth (HRS) can be increased, and the read margin when reading the resistance state set in the resistance change storage layer 43 can be increased.

Figure 18:
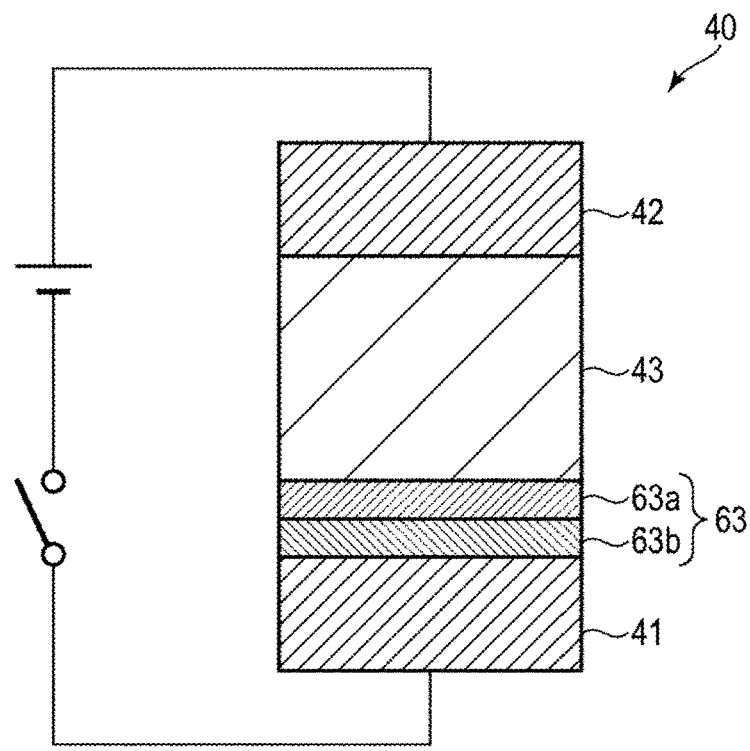
FIG. 18 is a view illustrating a resistance change storage element according to a second modification of a third embodiment and a direction in which a read voltage is applied to the resistance change storage element.

FIG. 18 is a view illustrating a resistance change storage element 40 according to a second modification of the present embodiment and a direction in which a read voltage is applied to the resistance change storage element 40.

In this modification, an interface layer 63 is provided between the electrode 41 and the resistance change storage layer 43, and includes an oxide layer 63a and an oxide layer 63b that are stacked.

When a voltage is applied between the electrode 41 and the electrode 42 to read out the resistance state of the resistance change storage layer 43, the voltage is applied so that the potential of the electrode 42 is relatively higher than the potential of the electrode 41. In such a case, among the oxide layer 63a and the oxide layer 63b, the oxide layer 63a having a relatively low oxygen areal density is located on the side of the electrode 42 to which a relatively high voltage is applied. Specifically, the oxide layer 63a having a relatively low oxygen areal density is in contact with the resistance change storage layer 43, and the oxide layer 63b having a relatively high oxygen areal density is in contact with the electrode 41.

The oxide layer 63a having a relatively low oxygen areal density is a high-k layer. Specifically, the oxide layer 63a is a $Y_2O_3$ layer or a $La_2O_3$ layer.

The oxide layer 63b having a relatively high oxygen areal density is a $SiO_2$ layer.

In this modification as well, according to the same principle as in the above-described embodiment, when the resistance change storage layer 43 is in the high resistance state, an internal electric field is generated in the resistance change storage layer 43 from the lower interface to the upper interface. Therefore, as in the above-described embodiment, the threshold voltage Vth(LRS) does not shift when the resistance change storage layer 43 is in the low resistance state, but the threshold voltage Vth(HRS) shifts in the positive direction when the resistance change storage layer 43 is in the high resistance state. Therefore, also in this modification, the difference between Vth(LRS) and Vth(HRS) can be increased, and the read margin when reading the resistance state set in the resistance change storage layer 43 can be increased.

Figure 19:
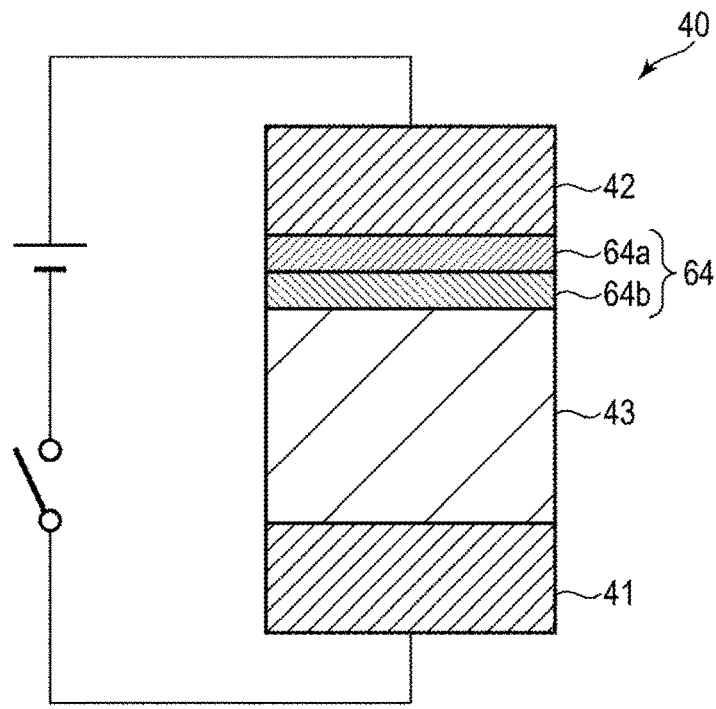
FIG. 19 is a view illustrating a resistance change storage element according to a third modification of a third embodiment and a direction in which a read voltage is applied to the resistance change storage element.

FIG. 19 is a view illustrating a resistance change storage element 40 according to a third modification of the present embodiment and a direction in which a read voltage is applied to the resistance change storage element 40.

In this modification, an interface layer 64 is provided between the electrode 42 and the resistance change storage layer 43, and includes an oxide layer 64a and an oxide layer 64b that are stacked.

When a voltage is applied between the electrode 41 and the electrode 42 to read out the resistance state of the resistance change storage layer 43, the voltage is applied so that the potential of the electrode 42 is relatively higher than the potential of the electrode 41. In such a case, among the oxide layer 64a and the oxide layer 64b, the oxide layer 64a having a relatively low oxygen areal density is located on the side of the electrode 42 to which a relatively high voltage is applied. Specifically, the oxide layer 64a having a relatively low oxygen areal density is in contact with the electrode 42, and the oxide layer 64b having a relatively high oxygen areal density is in contact with the resistance change storage layer 43.

The oxide layer 64a having a relatively low oxygen areal density is a $SiO_2$ layer.

The oxide layer 64b having a relatively high oxygen areal density is a high-k layer. Specifically, the oxide layer 64b is a $TiO_2$ layer, a $Ta_2O_5$ layer, a $ZrO_2$ layer, a $Sc_2O_3$, an $Al_2O_3$, or a $HfO_2$ layer.

In this modification as well, according to the same principle as in the above-described embodiment, when the resistance change storage layer 43 is in the high resistance state, an internal electric field is generated in the resistance change storage layer 43 from the lower interface to the upper interface. Therefore, as in the above-described embodiment, the threshold voltage Vth(LRS) does not shift when the resistance change storage layer 43 is in the low resistance state, but the threshold voltage Vth(HRS) shifts in the positive direction when the resistance change storage layer 43 is in the high resistance state. Therefore, also in this modification, the difference between Vth(LRS) and Vth(HRS) can be increased, and the read margin when reading the resistance state set in the resistance change storage layer 43 can be increased.

Figure 20:
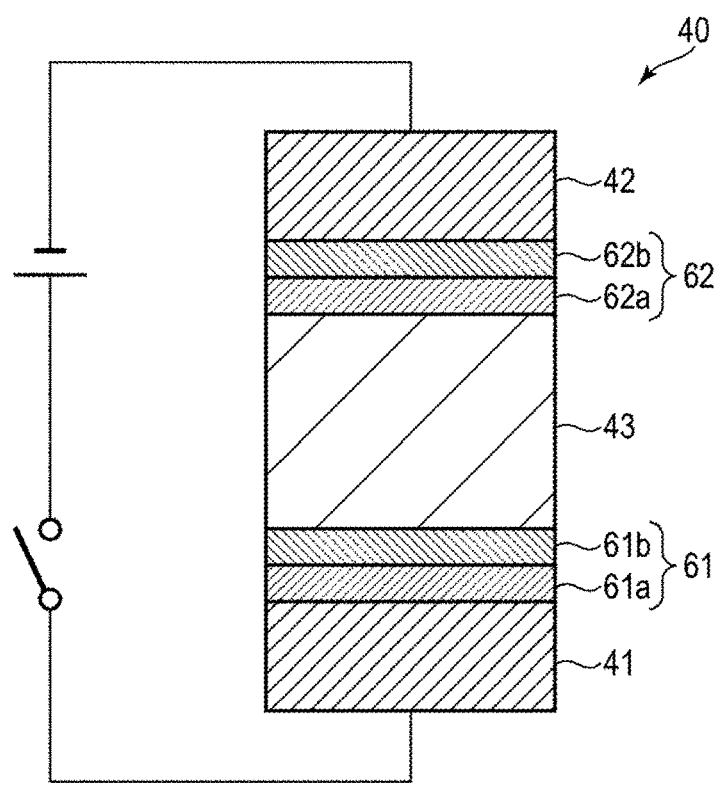
FIG. 20 is a view illustrating a resistance change storage element according to a fourth modification of a third embodiment and a direction in which a read voltage is applied to the resistance change storage element.

FIG. 20 is a view illustrating a resistance change storage element 40 according to a fourth modification of the present embodiment and a direction in which a read voltage is applied to the resistance change storage element 40.

In this modification, the interface layer 61 is provided between the electrode 41 and the resistance change storage layer 43, and the interface layer 62 is provided between the electrode 42 and the resistance change storage layer 43. The interface layer 61 is the same as the interface layer 61 illustrated in FIG. 13, and the interface layer 62 is the same as the interface layer 62 illustrated in FIG. 17. That is, this modification has a configuration in which the above-described embodiment and the first modification are combined.

Therefore, also in this modification, it is possible to obtain the same effect as that described in the above-described embodiment. Further, in this modification, since the interface layer 61 and the interface layer 62 are provided between the electrode 41 and the resistance change storage layer 43 and between the electrode 42 and the resistance change storage layer 43, respectively, it is possible to increase the shift amount of the threshold voltage Vth(HRS) when the resistance change storage layer 43 is in the high resistance state. Therefore, it is possible to further increase the read margin when reading the resistance state set in the resistance change storage layer 43.

Figure 21:
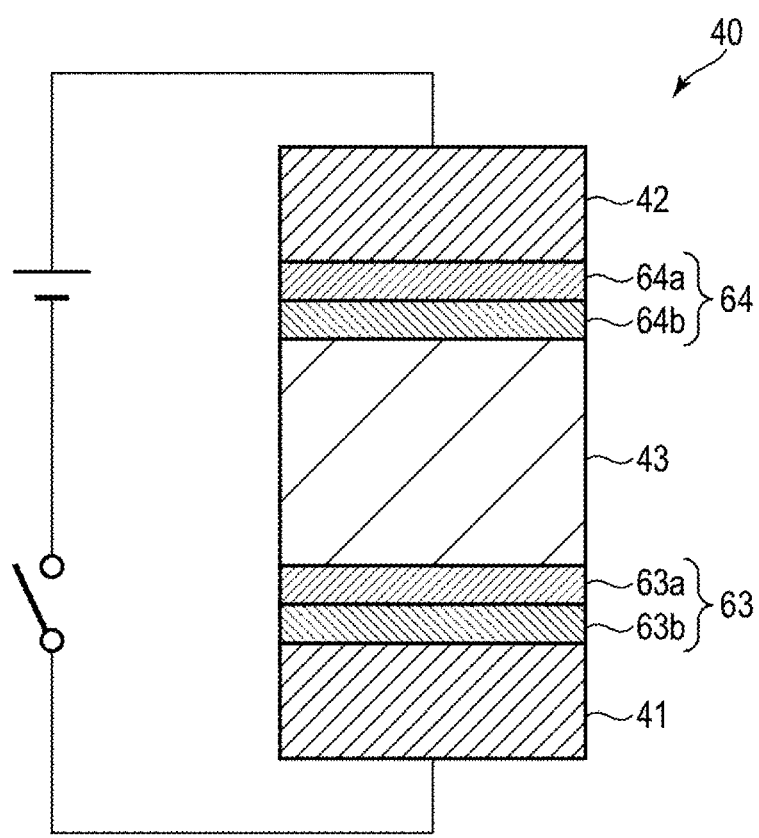
FIG. 21 is a view illustrating a resistance change storage element according to a fifth modification of a third embodiment and a direction in which a read voltage is applied to the resistance change storage element.

FIG. 21 is a view illustrating a resistance change storage element 40 according to a fifth modification of the present embodiment and a direction in which a read voltage is applied to the resistance change storage element 40.

In this modification, the interface layer 63 is provided between the electrode 41 and the resistance change storage layer 43, and the interface layer 64 is provided between the electrode 42 and the resistance change storage layer 43. The interface layer 63 is the same as the interface layer 63 illustrated in FIG. 18, and the interface layer 64 is the same as the interface layer 64 illustrated in FIG. 19. That is, this modification has a configuration in which the above-mentioned second and third modifications are combined.

Therefore, also in this modification, it is possible to obtain the same effect as that described in the above-described embodiment. Further, in this modification, since the interface layer 63 and the interface layer 64 are provided between the electrode 41 and the resistance change storage layer 43 and between the electrode 42 and the resistance change storage layer 43, respectively, it is possible to increase the shift amount of the threshold voltage Vth(HRS) when the resistance change storage layer 43 is in the high resistance state. Therefore, it is possible to further increase the read margin when reading the resistance state set in the resistance change storage layer 43.

Figure 22:
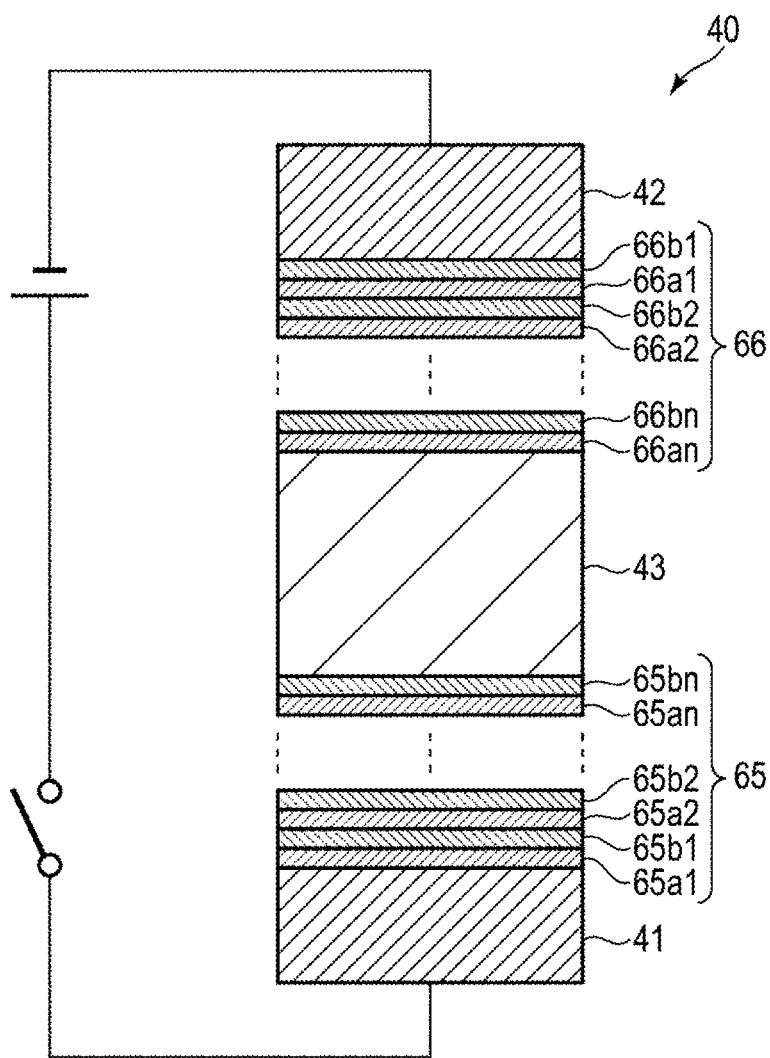
FIG. 22 is a view illustrating a resistance change storage element according to a sixth modification of a third embodiment and a direction in which a read voltage is applied to the resistance change storage element.

FIG. 22 is a view illustrating a resistance change storage element 40 according to a sixth modification of the present embodiment and a direction in which a read voltage is applied to the resistance change storage element 40.

In this modification, an interface layer 65 is provided between the electrode 41 and the resistance change storage layer 43, and an interface layer 66 is provided between the electrode 42 and the resistance change storage layer 43. The interface layer 65 has a configuration in which a plurality of oxide layers 65a1 to 65an having a relatively low oxygen areal density and a plurality of oxide layers 65b1 to 65bn having a relatively high oxygen areal density are alternately stacked. Similarly, the interface layer 66 has a configuration in which a plurality of oxide layers 66a1 to 66an having a relatively low oxygen areal density and a plurality of oxide layers 66b1 to 66bn having a relatively high oxygen areal density are alternately stacked.

In a first example of this modification, the oxide layers 65a1 to 65an and the oxide layers 66b1 to 66bn are formed of SiO$_2$ layers, and the oxide layers 65b1 to 65bn and the oxide layers 66a1 to 66an are formed of high-k layers. The oxide layers 65b1 to 65bn have a relatively high oxygen areal density compared to the SiO$_2$ layers, and the oxide layers 66a1 to 66an have a relatively low oxygen areal density compared to the SiO$_2$ layers. The high-k layers are each the same as the high-k layer already described.

In a second example of this modification, the oxide layer 65a1 and the oxide layer 66b1 are SiO$_2$ layers, and the oxide layers 65a2 to 65an, the oxide layers 65b1 to 65bn, the oxide layers 66a1 to 66an, and the oxide layers 66b2 to 66bn are high-k layers. The oxide layers 65b1 to 65bn have a relatively high oxygen areal density relative to the oxide layers 65a1 (a SiO$_2$ layer in this example) to 65an. The oxide layers 66a1 to 66an have a relatively low oxygen areal density compared to the oxide layers 66b1 (a SiO$_2$ layer in this example) to 66bn. The high-k layers are each the same as the high-k layer already described.

In this modification, the same effect can be obtained even when only one of the interface layer 65 and the interface layer 66 is provided.

Figure 23:
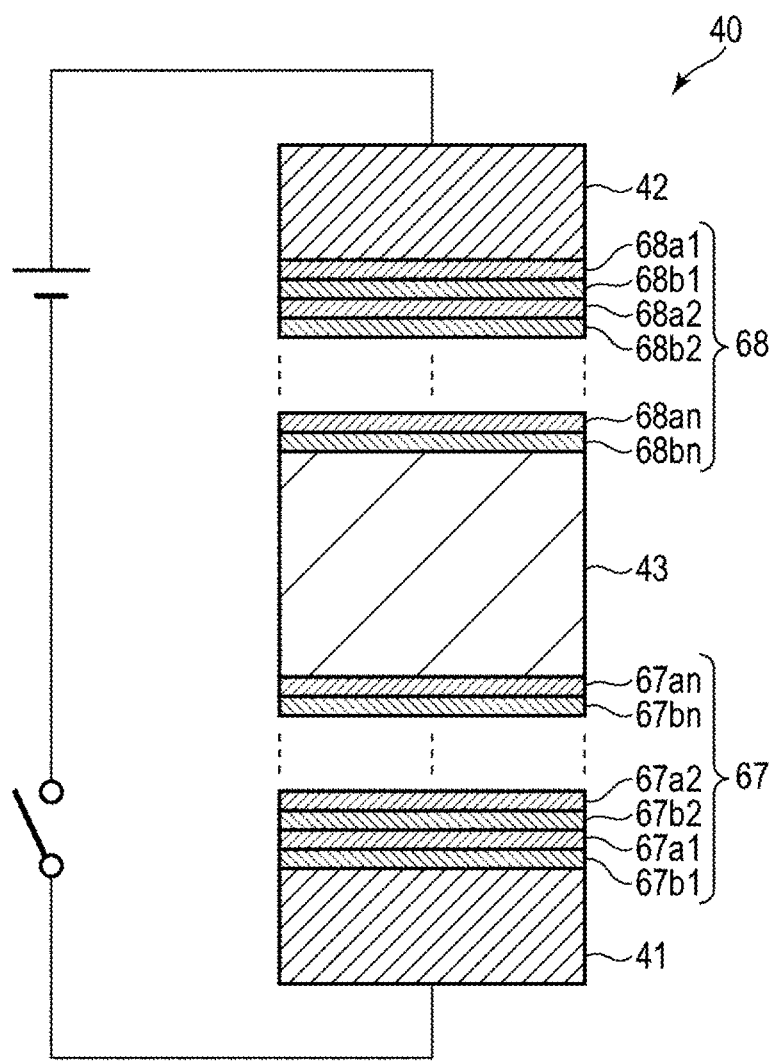
FIG. 23 is a view illustrating a resistance change storage element according to a seventh modification of a third embodiment and a direction in which a read voltage is applied to the resistance change storage element.

FIG. 23 is a view illustrating a resistance change storage element 40 according to a seventh modification of the present embodiment and a direction in which a read voltage is applied to the resistance change storage element 40.

In this modification, an interface layer 67 is provided between the electrode 41 and the resistance change storage layer 43, and an interface layer 68 is provided between the electrode 42 and the resistance change storage layer 43. The interface layer 67 has a configuration in which a plurality of oxide layers 67a1 to 67an having a relatively low oxygen areal density and a plurality of oxide layers 67b1 to 67bn having a relatively high oxygen areal density are alternately stacked. Similarly, the interface layer 68 has a configuration in which a plurality of oxide layers 68a1 to 68an having a relatively low oxygen areal density and a plurality of oxide layers 68b1 to 68bn having a relatively high oxygen areal density are alternately stacked.

In a first example of this modification, the oxide layers 67b1 to 67bn and the oxide layers 68a1 to 68an are formed of SiO$_2$ layers, and the oxide layers 67a1 to 67an and the oxide layers 68b1 to 68bn are formed of high-k layers. The oxide layers 67a1 to 67an have a relatively low oxygen areal density compared to the SiO$_2$ layers, and the oxide layers 68b1 to 68bn have a relatively high oxygen areal density compared to the SiO$_2$ layers. The high-k layers are each the same as the high-k layer already described.

In a second example of this modification, the oxide layer 67b1 and the oxide layer 68a1 are SiO$_2$ layers, and the oxide layers 67a1 to 67an, the oxide layers 67b2 to 67bn, the oxide layers 68a2 to 68an, and the oxide layers 68b1 to 68bn are high-k layers. The oxide layers 67a1 to 67an have a relatively low oxygen areal density relative to the oxide layers 67b1 (a SiO$_2$ layer in this example) to 67bn. The oxide layers 68b1 to 68bn have a relatively high oxygen areal density compared to the oxide layers 68a1 (a SiO$_2$ layer in this example) to 68an. The high-k layers are each the same as the high-k layer already described.

The basic configuration of this modification is the same as that of the above-described embodiment. In this modification as well, it is possible to obtain the same effect as that of the above-described embodiment.

In this modification, the same effect can be obtained even when only one of the interface layer 67 and the interface layer 68 is provided.

Figure 24:
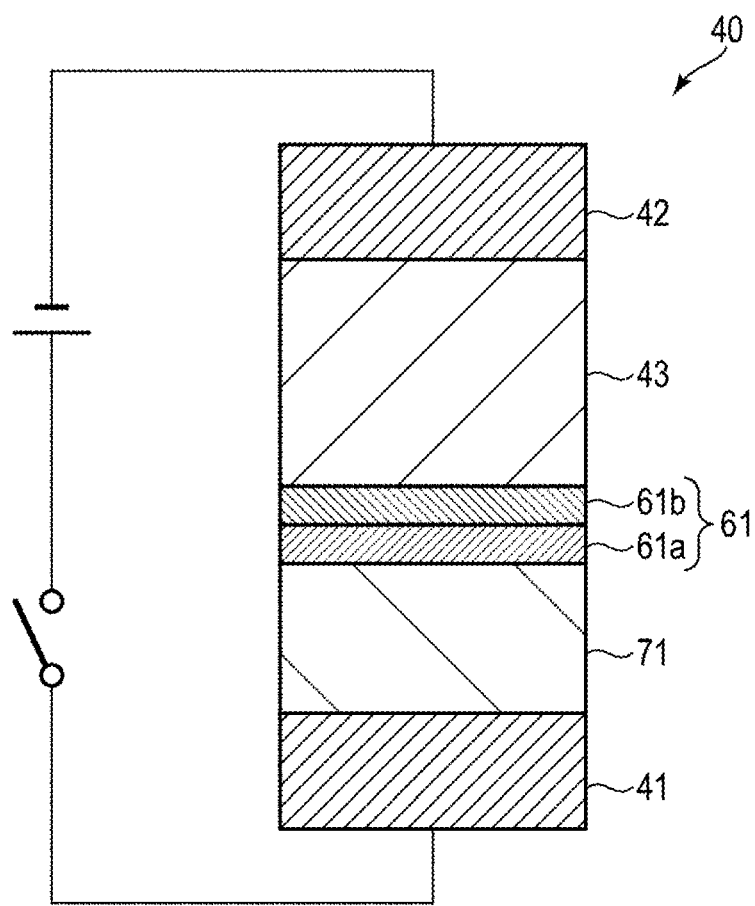
FIG. 24 is a view illustrating a resistance change storage element according to an eighth modification of a third embodiment and a direction in which a read voltage is applied to the resistance change storage element.

FIG. 24 is a view illustrating a resistance change storage element 40 according to an eighth modification of the present embodiment and a direction in which a read voltage is applied to the resistance change storage element 40.

In this modification, a selector material layer or a switching material layer 71 is provided between the electrode 41 and the electrode 42. That is, the selector material layer 71 is provided in series with the stacked film of the resistance change storage layer 43 and the interface layer 61. The basic function of the selector material layer 71 is the same as that of the selector 70 described with reference to FIG. 14, and has a switching function.

In the example illustrated in FIG. 24, the selector material layer 71 is provided between the electrode 41 and the stacked film of the resistance change storage layer 43 and the interface layer 61. Alternatively, the selector material layer 71 may be provided between the electrode 42 and the stacked film of the resistance change storage layer 43 and the interface layer 61.

In the example illustrated in FIG. 24, the selector material layer 71 is added to the configuration illustrated in FIG. 13. Alternatively, the selector material layer 71 may be added to the other configurations as illustrated in the first to seventh modifications.

Figure 25:
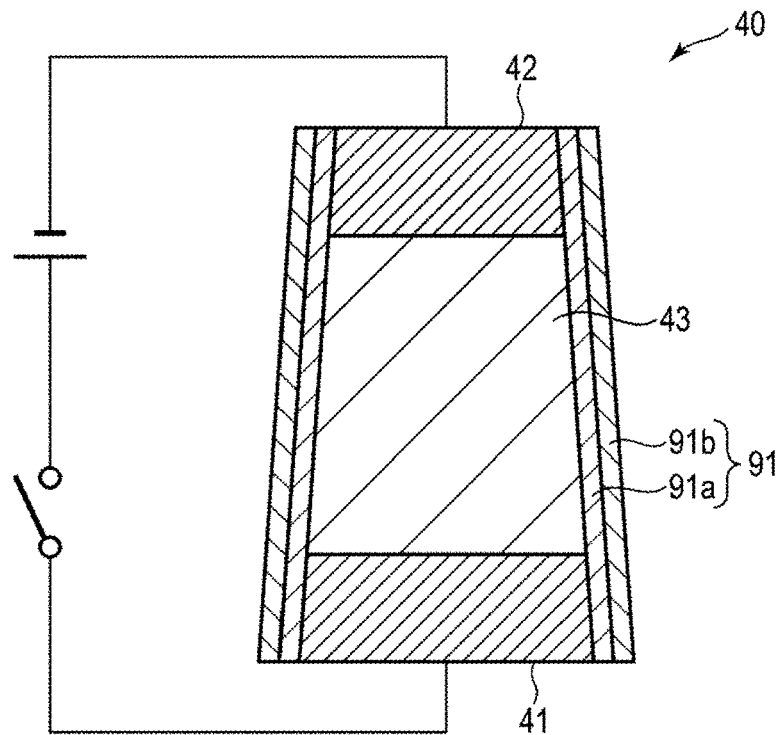
FIG. 25 is a view illustrating a resistance change storage element according to a ninth modification of a third embodiment and a direction in which a read voltage is applied to the resistance change storage element.

FIG. 25 is a view illustrating a resistance change storage element 40 according to a ninth modification of the present embodiment and a direction in which a read voltage is applied to the resistance change storage element 40.

In the above-described embodiment and the first to eighth modifications, an interface layer is provided between the electrode 41 and the resistance change storage layer 43 or between the electrode 42 and the resistance change storage layer 43. In this modification, an interface layer 91 is provided around the side surface of the resistance change storage layer 43. Specifically, an oxide layer 91a having a relatively low oxygen areal density is provided on the side closer to the side surface of the resistance change storage layer 43, and an oxide layer 91b having a relatively high oxygen areal density is provided on the side farther from the side surface of the resistance change storage layer 43. Further, in this modification, the side surface of the resistance change storage layer 43 is inclined in a tapered shape.

In this modification, the interface layer 91 including the oxide layers 91a and 91b is provided around the side surface of the resistance change storage layer 43, and the side surface of the resistance change storage layer 43 is inclined in a tapered shape. Therefore, the vertical component of the internal electric field generated in the resistance change storage layer 43 corresponds to the direction from the electrode 42 to the electrode 41. As a result, by applying a voltage so that the potential of the electrode 41 is relatively higher than the potential of the electrode 42, according to the same principle as the principle described in the above-described embodiment, the threshold voltage Vth(HRS) when the resistance change storage layer 43 is set to the high resistance state can be shifted in the positive direction. Therefore, even in this modification, it is possible to obtain the same effect as that described in the above-described embodiment.

Figure 26:
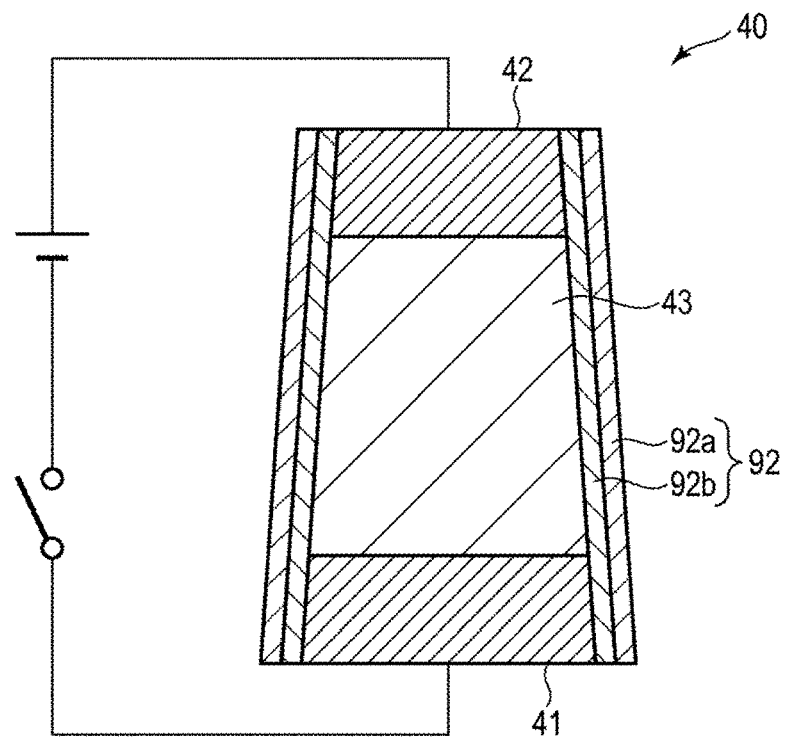
FIG. 26 is a view illustrating a resistance change storage element according to a tenth modification of a third embodiment and a direction in which a read voltage is applied to the resistance change storage element.

FIG. 26 is a view illustrating a resistance change storage element 40 according to a tenth modification of the present embodiment and a direction in which a read voltage is applied to the resistance change storage element 40.

In this modification as well, as in the ninth modification, an interface layer 92 is provided around the side surface of the resistance change storage layer 43, and the side surface of the resistance change storage layer 43 is inclined in a tapered shape. In this modification, an oxide layer 92b having a relatively high oxygen areal density is provided on the side closer to the side surface of the resistance change storage layer 43, and an oxide layer 92a having a relatively low oxygen areal density is provided on the side farther from the side surface of the resistance change storage layer 43.

In this modification, the vertical component of the internal electric field generated in the resistance change storage layer 43 corresponds to the direction from the electrode 41 to the electrode 42. As a result, by applying a voltage so that the potential of the electrode 42 is relatively higher than the potential of the electrode 41, according to the same principle as the principle described in the above-described embodiment, the threshold voltage Vth(HRS) when the resistance change storage layer 43 is set to the high resistance state can be shifted in the positive direction. Therefore, even in this modification, it is possible to obtain the same effect as that described in the above-described embodiment.

In the present disclosure, an iPCM element may be used as the resistance change storage element 40 in any of the above-described examples.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device, comprising:
   a resistance change storage element including:
   a first electrode,
   a second electrode,
   a resistance change storage layer between the first and second electrodes, the storage layer being either in a first resistance state or a second resistance state, the storage layer having a higher resistance in the second resistance state than in the first resistance state, and
   a first interface layer between the first electrode and the resistance change storage layer and including a first oxide layer and a second oxide layer that are stacked, wherein
   one of the first and second oxide layers that has a lower oxygen areal density is located closer to one of the first and second electrodes that is at a higher potential when a voltage is applied between the first and second electrodes.

2. The storage device according to claim 1, wherein the resistance change storage layer comprises at least two elements selected from a group consisting of germanium, antimony, and tellurium.

3. The storage device according to claim 1, wherein
   one of the first and second oxide layers is a silicon oxide layer, and
   the other of the first and second oxide layers is a titanium oxide layer, a tantalum oxide layer, a zirconium oxide layer, a scandium oxide layer, an aluminum oxide layer, or a hafnium oxide layer.

4. The storage device according to claim 1, wherein
   one of the first and second oxide layers is an yttrium oxide layer or a lanthanum oxide layer, and
   the other of the first and second oxide layers is a silicon oxide layer.

5. The storage device according to claim 1, further comprising:
   a second interface layer between the second electrode and the resistance change storage layer and including a third oxide layer and a fourth oxide layer that are stacked, wherein
   one of the third and fourth oxide layers that has a lower oxygen areal density is closer to one of the first and second electrodes that is at a higher potential when the voltage is applied between the first and second electrodes.

6. The storage device according to claim 1, further comprising:
   a switching element connected in series to the resistance change storage element.

7. The storage device according to claim 1, further comprising:
   a first wiring extending along a first direction; and
   a second wiring extending along a second direction crossing the first direction, wherein
   the resistance change storage element extends along a third direction crossing the first and second directions between the first and second wirings.

* * * * *